United States Patent
Tyan

(10) Patent No.: US 6,703,179 B2
(45) Date of Patent: Mar. 9, 2004

(54) TRANSFER OF ORGANIC MATERIAL FROM A DONOR TO FORM A LAYER IN AN OLED DEVICE

(75) Inventor: Yuan-Sheng Tyan, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 153 days.

(21) Appl. No.: 10/098,020

(22) Filed: Mar. 13, 2002

(65) Prior Publication Data

US 2003/0180638 A1 Sep. 25, 2003

(51) Int. Cl.$^7$ .............................. G03F 7/34; G03F 7/20; B27G 11/02; B32B 31/00; G01D 15/10
(52) U.S. Cl. .................... 430/200; 430/201; 156/379.8; 156/234; 156/382; 347/222; 347/262; 355/73
(58) Field of Search ................... 430/200, 201; 347/222, 262; 156/379.8, 382, 234, 540; 355/73

(56) References Cited

U.S. PATENT DOCUMENTS

| | | |
|---|---|---|
| 5,578,416 A | 11/1996 | Tutt |
| 5,688,551 A | 11/1997 | Littman et al. |
| 5,742,129 A | 4/1998 | Nagayama et al. |
| 5,851,709 A | 12/1998 | Grande et al. |
| 5,937,272 A | 8/1999 | Tang |
| 6,114,088 A | 9/2000 | Wolk et al. |
| 6,140,009 A | 10/2000 | Wolk et al. |
| 6,214,520 B1 | 4/2001 | Wolk et al. |
| 6,221,553 B1 | 4/2001 | Wolk et al. |
| 6,555,284 B1 * | 4/2003 | Boroson et al. ............. 430/200 |
| 6,582,875 B1 * | 6/2003 | Kay et al. ................... 430/200 |
| 2003/0113656 A1 * | 6/2003 | Tyan et al. ................. 430/200 |
| 2003/0148208 A1 * | 8/2003 | Phillips et al. .............. 430/200 |

FOREIGN PATENT DOCUMENTS

EP 1 028 001 8/2000

* cited by examiner

Primary Examiner—Richard L. Schilling
(74) Attorney, Agent, or Firm—Raymond L. Owens

(57) ABSTRACT

Method and apparatus are disclosed for transferring organic material from a donor onto a substrate to form a layer of organic material on one or more OLED devices, by aligning first and second fixtures in a reduced pressure environment and positioning the substrate and donor in a chamber defined by the aligned first and second fixtures; increasing the pressure applied to the non-transfer surface of the donor so as to ensure the position of the donor relative to the substrate; moving a member provided on the first fixture from a closed to an open position which permits the transmission of radiation onto the non-transfer surface of the donor so that heat will be produced and organic material transferred from the donor to the substrate; and illuminating with radiation the donor through the open radiation-receiving position to cause the transfer of organic material to the substrate.

7 Claims, 9 Drawing Sheets

TRANSFER OF ORGANIC MATERIAL FROM A DONOR TO FORM A LAYER IN AN OLED DEVICE

CROSS REFERENCE TO RELATED APPLICATION

Reference is made to commonly assigned U.S. patent application Ser. No. 10/021,410 filed Dec. 12, 2001, entitled "Apparatus For Permitting Transfer of Organic Material From a Donor to Form a Layer in an OLED Device" by Phillips, et al.; the disclosures of which are incorporated herein by reference.

FIELD OF THE INVENTION

The present invention relates to organic electroluminescent (EL) devices, also known as organic light-emitting diodes (OLEDs), and particularly to transferring organic material from a donor to form one or more organic layers in such devices.

BACKGROUND OF THE INVENTION

In color or full-color organic electroluminescent (EL) displays having an array of colored pixels such as red, green, and blue color pixels (commonly referred to as RGB pixels), precision patterning of the color-producing organic EL media is required to produce the RGB pixels. The basic EL device has in common an anode, a cathode, and an organic EL medium sandwiched between the anode and the cathode. The organic EL medium can consist of one or more layers of organic thin films, where one of the layers or regions within a layer is primarily responsible for light generation or electroluminescence. This particular layer is generally referred to as the light-emitting layer of the organic EL medium. Other organic layers present in the organic EL medium commonly facilitate electronic transportation, and are referred to as either the hole-transporting layer (for hole conduction) or electron-transporting layer (for electron conduction). In forming the RGB pixels in a full-color organic EL display panel, it is necessary to devise a method to precisely pattern the emissive layer of the organic EL medium or the entire organic EL medium.

Typically, electroluminescent pixels are formed on the display by shadow masking techniques, such as shown in commonly-assigned U.S. Pat. No. 5,742,129. Although this has been effective, it has several drawbacks. It has been difficult to achieve high resolution of pixel sizes using shadow masking. Moreover, there are problems of alignment between the substrate and the shadow mask, and care must be taken that pixels are formed in the appropriate locations. When it is desirable to increase the substrate size, it is difficult to manipulate the shadow mask to form appropriately positioned pixels. A further disadvantage of the shadow mask method is that the mask holes can become plugged with time. Plugged holes on the mask lead to the undesirable result of non-functioning pixels on the EL display.

There are further problems with the shadow mask method, which become especially apparent when making EL devices with dimensions of more than a few inches on a side. It is extremely difficult to manufacture larger shadow masks with the required precision (hole position of ±5 micrometers) for accurately forming EL devices.

A method for patterning high-resolution organic EL displays has been disclosed in commonly-assigned U.S. Pat. No. 5,851,709 by Grande et al. This method is comprised of the following sequences of steps: 1) providing a donor substrate having opposing first and second surfaces; 2) forming a light-transmissive, heat-insulating layer over the first surface of the donor substrate; 3) forming a light-absorbing layer over the heat-insulating layer; 4) providing the donor substrate with an array of openings extending from the second surface to the heat-insulating layer; 5) providing a transferable, color-forming, organic donor layer formed on the light-absorbing layer; 6) precision aligning the donor substrate with the display substrate in an oriented relationship between the openings in the substrate and the corresponding color pixels on the device; and 7) employing a source of radiation for producing sufficient heat at the light-absorbing layer over the openings to cause the transfer of the organic layer on the donor substrate to the display substrate. A problem with the Grande et al. approach is that patterning of an array of openings on the donor substrate is required. This creates many of the same problems as the shadow mask method, including the requirement for precision mechanical alignment between the donor substrate and the display substrate. A further problem is that the donor pattern is fixed and cannot be changed readily.

Using an unpatterned donor sheet and a precision light source, such as a laser, can remove some of the difficulties seen with a patterned donor. Such a method is disclosed by Littman in commonly-assigned U.S. Pat. No. 5,688,551, and in a series of patents by Wolk et al. (U.S. Pat. Nos. 6,114,088; 6,140,009; 6,214,520; and 6,221,553).

In commonly-assigned U.S. Pat. No. 5,937,272, Tang has taught a method of patterning multicolor pixels (e.g. red, green, and blue subpixels) onto a thin-film-transistor (TFT) array substrate by vapor deposition of an EL material. Such EL material can be precoated on one surface of a donor support material and transferred to a substrate by vapor deposition in a selected pattern (as in FIGS. 4, 5, and 6 in the aforementioned U.S. Pat. No. 5,937,272).

The EL material transfer is preferably done in a vacuum chamber such as Tang describes in the aforementioned patent and, in particular, vacuum is preferably maintained between the donor and substrate. The donor and substrate must also be kept in close proximity during the EL transfer (less than 250 micrometers between the coating and raised portions of the substrate as taught by Tang). Furthermore, the donor can be in contact with the raised portions of the substrate and thereby maintain sufficient spacing between the coating and the recessed portions of the substrate where the EL material is deposited. In any case, a method of holding the donor and substrate in contact in a vacuum chamber while maintaining vacuum between the donor and substrate is required.

Isberg, et al., in commonly assigned European Patent Application 1 028 001 A1, have disclosed the additional use of an adhesion-promoting layer between the donor layer and substrate. While this would help promote the close contact required by Tang, it would be disadvantageous because the adhesion-promoting layer can introduce impurities in the form of the adhesive.

SUMMARY OF THE INVENTION

It is therefore an object of the present invention to provide a more effective way of positioning a donor element relative to an OLED substrate for facilitating the formation of one or more layers of organic material.

This object is achieved by an apparatus for transferring organic material from a donor onto a substrate to form a layer of organic material on one or more OLED devices, comprising:

(a) a vacuum chamber under reduced pressure;
(b) a first fixture disposed in the vacuum chamber;
(c) a second fixture disposed in the vacuum chamber and to be aligned with and engaging the first fixture to clamp the donor and substrate which are supported by at least one of the first and second fixtures and forming a second chamber positioned relative to a non-transfer surface of the donor;
(d) means for supplying a gas to the second chamber to apply pressure to the non-transfer surface of the donor so as to ensure the position of the donor relative to the substrate;
(e) the first fixture including a movable member movable between a closed position defining a surface of the chamber and an open radiation-receiving position to permit transmission of radiation to the non-transfer surface of the donor so that heat will be produced and the organic material will transfer from the donor to the substrate; and
(f) an illumination source for directing radiation onto the donor through the open radiation-receiving position to cause the transfer of organic material to the substrate.

This object is also achieved by a method for transferring organic material from a donor onto a substrate to form a layer of organic material on one or more OLED devices, comprising the steps of:
(a) aligning first and second fixtures in a reduced pressure environment and positioning the substrate and donor in a chamber defined by the aligned first and second fixtures;.
(b) increasing the pressure applied to the non-transfer surface of the donor so as to ensure the position of the donor relative to the substrate;
(c) after step b, moving a member provided on the first fixture from a closed to an open position which permits the transmission of radiation onto the non-transfer surface of the donor so that heat will be produced and organic material transferred from the donor to the substrate; and
(d) illuminating with radiation the donor through the open radiation-receiving position to cause the transfer of organic material to the substrate.

An advantage to this method is that it provides for maintaining a uniform spacing between a donor material and a substrate in an ambient vacuum or vacuum environment and where it is further preferred that vacuum be maintained between the donor and substrate. This enables suitable clamping in an environment (vacuum) that is advantageous for lowering contamination. A further advantage is that the method and apparatus reduce the likelihood of optical distortion. A further advantage is that the apparatus described herein can be more easily scaled up to produce larger display units than other methods. A further advantage is that the chamber formed by the first and second fixtures in the apparatus can be made small so that it can be pressurized and evacuated quickly, allowing high throughput. A further advantage is that this invention can be filly automated including donor and substrate media handling. The present invention is particularly suitable for forming organic layers over a large area having a number of OLED display devices, which are in the process of being formed, thereby increasing throughput.

Figure 1:
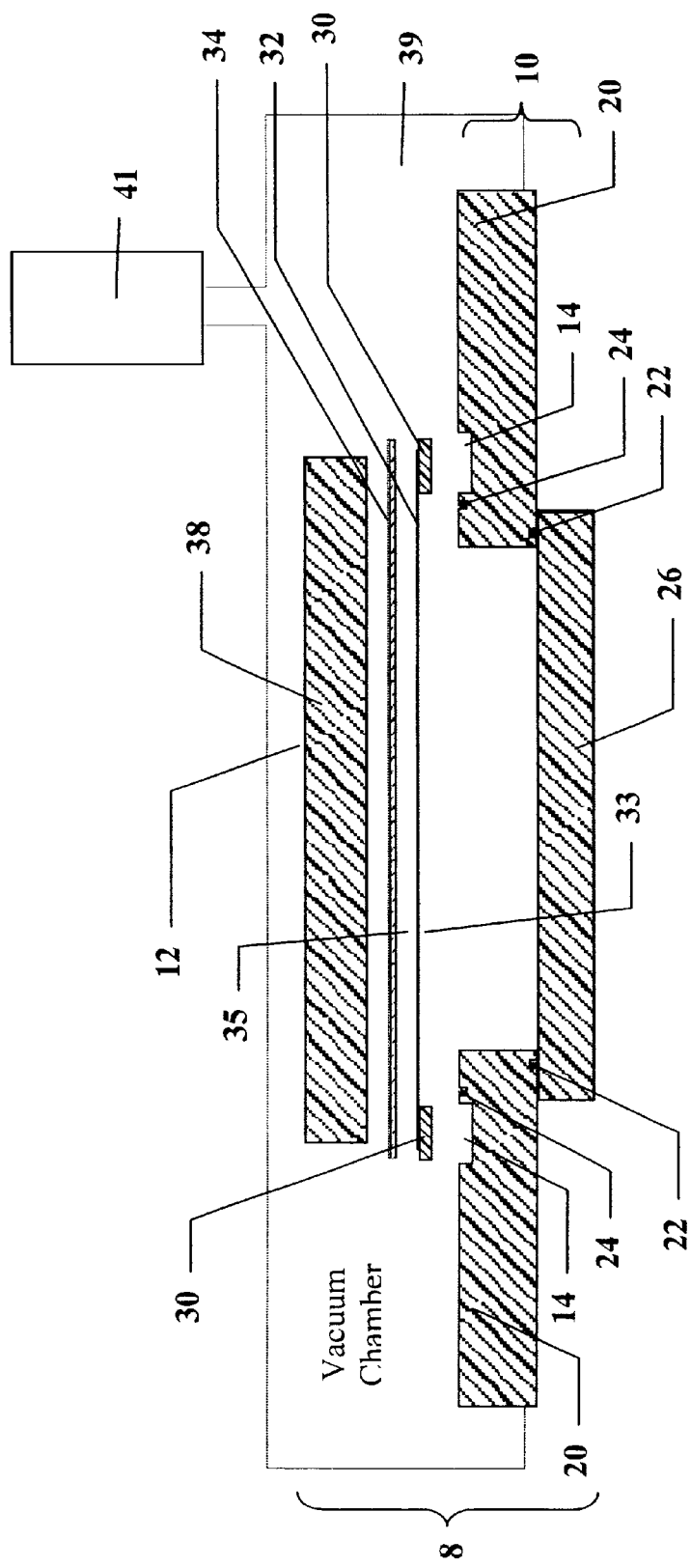
FIG. 1 is a cross-sectional view of one embodiment of an apparatus in open configuration designed in accordance with this invention.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "display" or "display panel" is employed to designate a screen capable of electronically displaying video images or text. The term "pixel" is employed in its art-recognized usage to designate an area of a display panel that can be stimulated to emit light independently of other areas. The term "OLED device" is used in its art-recognized meaning of a display device comprising organic light-emitting diodes as pixels. A color OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is employed to describe multicolor display panels that are capable of emitting in the red, green, and blue regions of the visible spectrum and displaying images in any combination of hues. The red, green, and blue colors constitute the three primary colors from which all other colors can be generated by appropriately mixing these three primaries. The term "hue" refers to the intensity profile of light emission within the visible spectrum, with different hues exhibiting visually discernible differences in color. The pixel or subpixel is generally used to designate the smallest addressable unit in a display panel. For a monochrome display, there is no distinction between pixel or subpixel. The term "subpixel" is used in multicolor display panels and is employed to designate any portion of a pixel which can be independently addressable to emit a specific color. For example, a blue subpixel is that portion of a pixel which can be addressed to emit blue light. In a full-color display, a pixel generally comprises three primary-color subpixels, namely blue, green, and red. The term "pitch" is used to designate the distance separating two pixels or subpixels in a display panel. Thus, a subpixel pitch means the separation between two subpixels.

Phillips, et al, in commonly assigned U.S. patent application Ser. No. 10/021,410, have disclosed an apparatus that provides pressure to one side of a donor element, thus promoting close contact between the donor element and a substrate, while maintaining a vacuum between the substrate and the donor element, and facilitating transfer on that side. While this is a useful apparatus, its design includes a transparent portion as part of a chamber to maintain the pressure against the donor element. Writing to the donor element, such as by a laser beam, is done through the transparent portion. To produce larger display devices by such an apparatus requires a larger transparent portion, necessitating a thicker transparent portion to maintain the pressure differential between the pressurized chamber and the vacuum chamber. The added thickness can create greater optical effects on the laser beam, such as refraction, reflection, and optical scattering, increasing the likelihood of optical distortion during the writing process, and increasing the likelihood of producing an unusable display device.

Turning now to FIG. 1, there is shown a cross-sectional view of one embodiment of an apparatus 8 in open configuration designed to form a layer of organic material on one or more OLED devices in accordance with this invention and including two fixtures. A first fixture 10 includes base plate 20 which, in this particular example, is an open rectangular plate that has been machined for the features to be described here. Base plate 20 supports donor 32 and substrate 34 and can further accommodate donor 32 mounted to rigid frame 30. Fitted against base plate 20 is movable member 26, which can be in the form of a plate as depicted here or other convenient shape. Movable member 26 is shown here in closed position. Movable member 26 can be moved to an open position so as to expose non-transfer surface 33 of donor 32. In closed position, movable member 26 fits against base plate 20 and compresses gasket 22, which fits into a slot that has been machined for it. In the closed position, movable member 26, gasket 22, and base plate 20 form an airtight seal, defined herein as having no fluid leaks or having a sufficiently low leak rate as to not adversely affect the environmental conditions within vacuum chamber 39. In this configuration, movable member 26 thus forms part of the inner surface of vacuum chamber 39. Base plate 20 has another machined slot, which holds gasket 24.

A second fixture 12 includes plate 38, which is aligned to engage with first fixture 10 in a manner that will become apparent, and thereby clamp substrate 34 and donor 32 to compress gasket 24 and to create an airtight chamber between non-transfer surface 33 of donor 32 and movable member 26. Plate 38 is made of a rigid material, such as steel or rigid plastic, and is preferably flat to within the focal depth of a laser.

The open relationship of the first and second fixtures 10 and 12 in FIG. 1 facilitates transfer of donor 32 and substrate 34 into and out of apparatus 8. Donor 32 is placed between the fixtures in such a way that it will be supported by first fixture 10. Substrate 34 is placed between donor 32 and second fixture 12. Since donor 32 can be formed from a flexible support, rigid frame 30 can optionally be used as a support for the loading and unloading of sheets of donor 32. In the case of the use of rigid frame 30, base plate 20 will include machined slot 14 for receiving rigid frame 30.

First fixture 10 is disposed in vacuum chamber 39 and forms a part of vacuum chamber 39. Second fixture 12 is also disposed in vacuum chamber 39. Vacuum chamber 39 includes vacuum pump 41 to maintain reduced pressure inside vacuum chamber 39. The terms "reduced pressure" and "vacuum" are defined as a pressure of 1 Torr or less. This is advantageous for certain types of transfer for several reasons: 1) the transfer across a non-contact gap is more effective under vacuum, and 2) some donor materials are sensitive to oxygen, moisture, or other contaminants.

Substrate 34 can be an organic solid, an inorganic solid, or a combination of organic and inorganic solids that provides a surface for receiving the organic material from a donor. Substrate 34 can be rigid or flexible and can be processed as separate individual pieces, such as sheets or wafers, or as a continuous roll. Typical substrate materials include glass, plastic, metal, ceramic, semiconductor, metal oxide, semiconductor oxide, semiconductor nitride, or combinations thereof. Substrate 34 can be a homogeneous mixture of materials, a composite of materials, or multiple layers of materials. Substrate 34 can be an OLED substrate, that is a substrate commonly used for preparing OLED devices, e.g. active-matrix low-temperature polysilicon TFT substrate. The substrate 34 can either be light transmissive or opaque, depending on the intended direction of light emission. The light transmissive property is desirable for viewing the EL emission through the substrate. Transparent glass or plastic are commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, ceramics, and circuit board materials.

Figure 2:
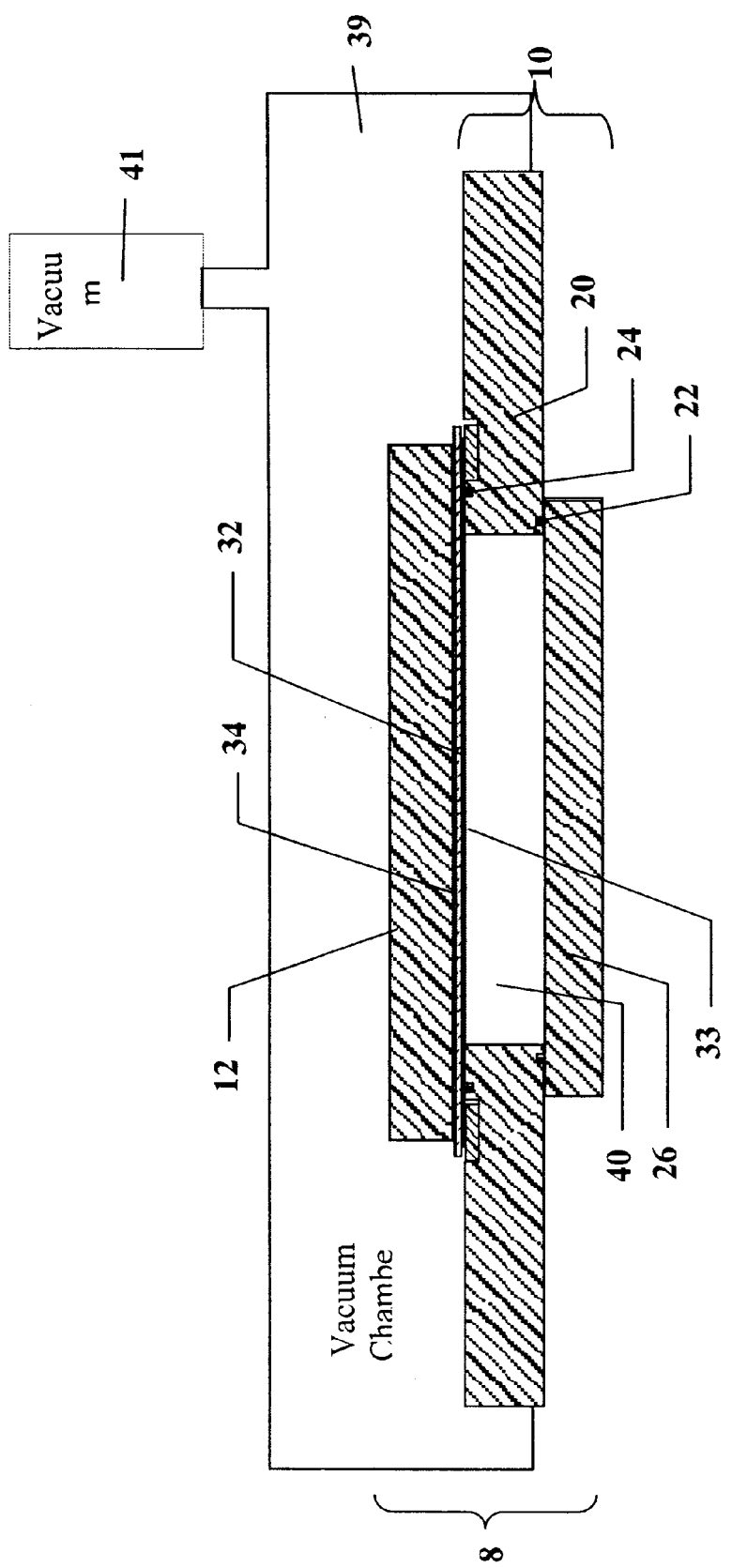
FIG. 2 is a cross-sectional view of the aforementioned apparatus in closed configuration.

FIG. 2 shows apparatus 8 of FIG. 1 in a closed configuration. First fixture 10 and second fixture 12 are aligned with each other so that they engage and in doing so define second chamber 40 and provide pressure along the perimeter of second chamber 40, thus clamping substrate 34 and donor 32 in a position in second chamber 40, compressing gasket 24, and creating an airtight seal. Together with the airtight seal formed by base plate 20 with gasket 22 and movable member 26, this forms second chamber 40 relative to non-transfer surface 33 of donor 32. In this configuration, movable member 26 thus forms part of the inner surface of second chamber 40. By means which will become evident, second chamber 40 can be vented without disturbing the vacuum in vacuum chamber 39 so that substrate 34 and donor 32 are disposed in a relationship relative to one another whereby there will be either a separation between portions of substrate 34 and donor 32, or substrate 34 and donor 32 will be in contact. Movable member 26 can then be opened, allowing an illumination source to illuminate non-transfer surface 33 of donor 32 with radiation. Second fixture 12 provides a flat surface that, in the case of irradiation by laser, locates an appropriate radiation-absorbing portion (whose nature will become apparent) of donor 32 within the focal depth of the laser.

It will be understood that the position and orientation of apparatus 8 and vacuum chamber 39 will determine the manner in which donor 32 and substrate 34 are supported. As shown in FIG. 2, both donor 32 and substrate 34 are initially supported by first fixture 10. Upon pressurizing second chamber 40, second fixture 12 can support substrate 34 against the pressure in second chamber 40. In the case in which apparatus 8 and vacuum chamber 39 are inverted, second fixture 12 can support both donor 32 and substrate 34.

Figure 3:
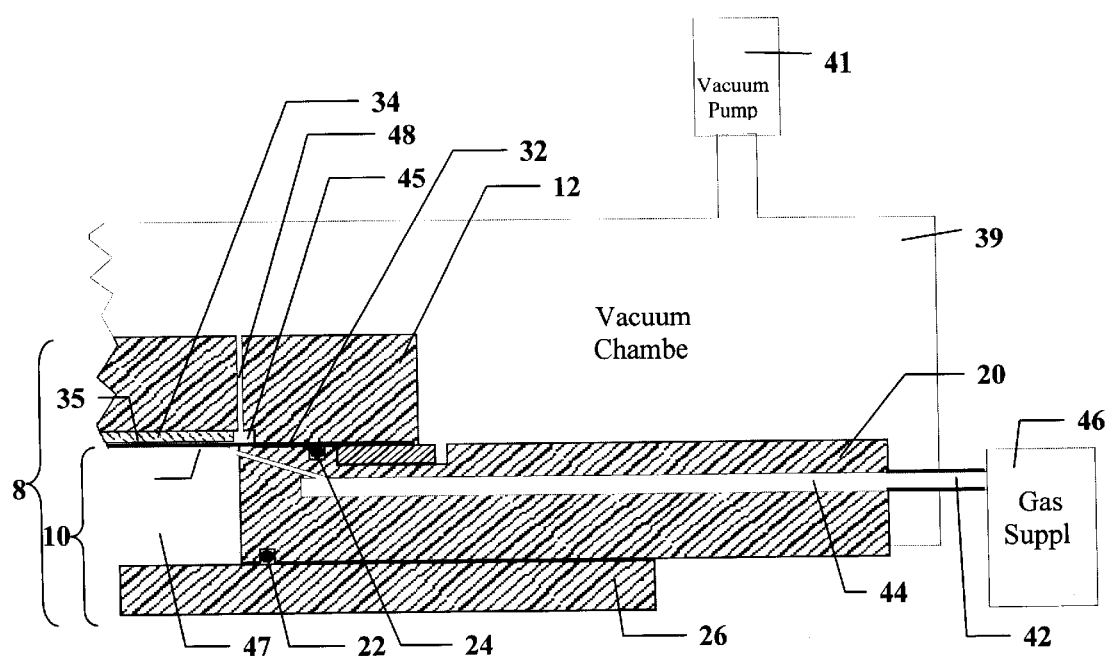
FIG. 3 is a portion of the apparatus of FIGS. 1 and 2 in a closed configuration showing additional detail.

FIG. 3 shows a portion of apparatus 8 in closed configuration in greater detail, and shows a means for supplying gas to second chamber 40 behind movable member 26 and a means for maintaining ambient pressure between substrate 34 and transfer surface 35 of donor 32. Second fixture 12 includes a recessed pocket that accommodates substrate 34. Donor 32 extends beyond substrate 34 and is clamped against gasket 24 by second fixture 12 when second fixture 12 engages with first fixture 10. This creates first chamber 45 over transfer surface 35 of donor 32 and second chamber 40 under non-transfer surface 33 of donor 32. One or more channels 48 are formed into second fixture 12 and are open to the vacuum environment in such a way that the airtight seal created at gasket 24 is not disrupted. Gas can be supplied to second chamber 40 by gas supply 46 via gas inlet 42 and gas passage 44. The gas can be any gaseous material, e.g. air, nitrogen, carbon dioxide, Freon, etc. Gas supply 46 can be e.g. a pressurized tank of gas or a valve. When gas supply 46 supplies gas to second chamber 40, pressure is applied to non-transfer surface 33 of donor 32, which is pressed against substrate 34 which, in turn, is pressed against plate 38. This ensures the desired position of donor 32 relative to substrate 34 and maintains such position. Channels 48 maintain vacuum pressure conditions on transfer surface 35 of donor 32 and on substrate 34 in first chamber 45 while non-transfer surface 33 is under relatively greater pressure in second chamber 40. When the pressure inside second chamber 40 equals that outside of movable member 26 and vacuum chamber 39, movable member 26 can be moved to its open position.

Figure 4A:
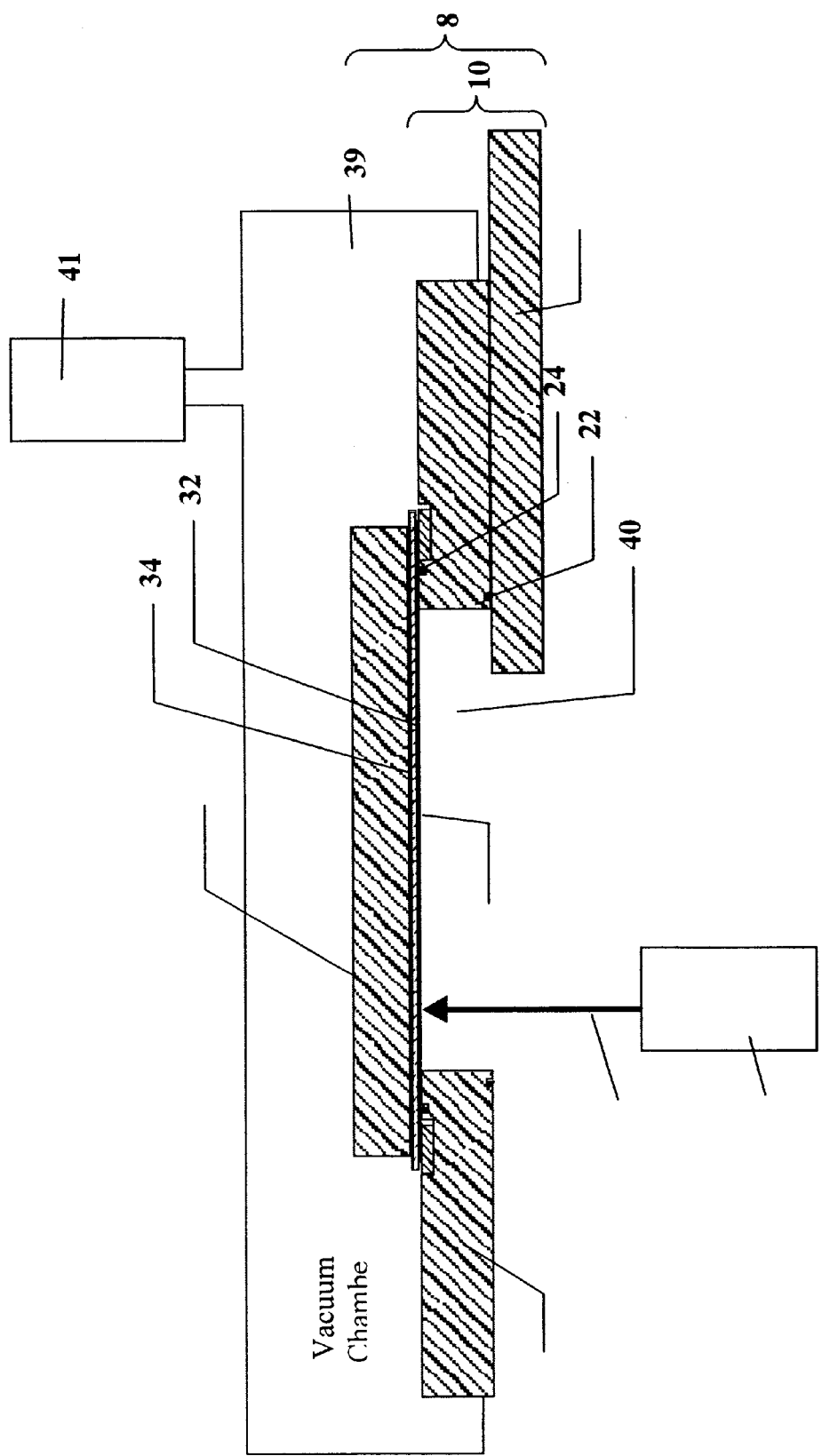
FIG. 4a is a cross-sectional view of the use of the aforementioned apparatus with laser light.

FIG. 4a shows one means of using apparatus 8 with light. Movable member 26 is shown in its open position, which is also called the radiation-receiving position because it permits the transmission of radiation to non-transfer surface 33 of donor 32. When movable member 26 is opened, laser 62 directs laser light 60 onto donor 32, and in doing so selectively illuminates portions of non-transfer surface 33 of donor 32 with radiation, for example laser light 60, for the purpose of transferring donor material to substrate 34. Other illumination sources that provide radiation can also be used such as a high powered collimated light or an e-beam or any other radiation that causes the transfer of material from the donor 32 to the substrate 34.

Figure 4B:
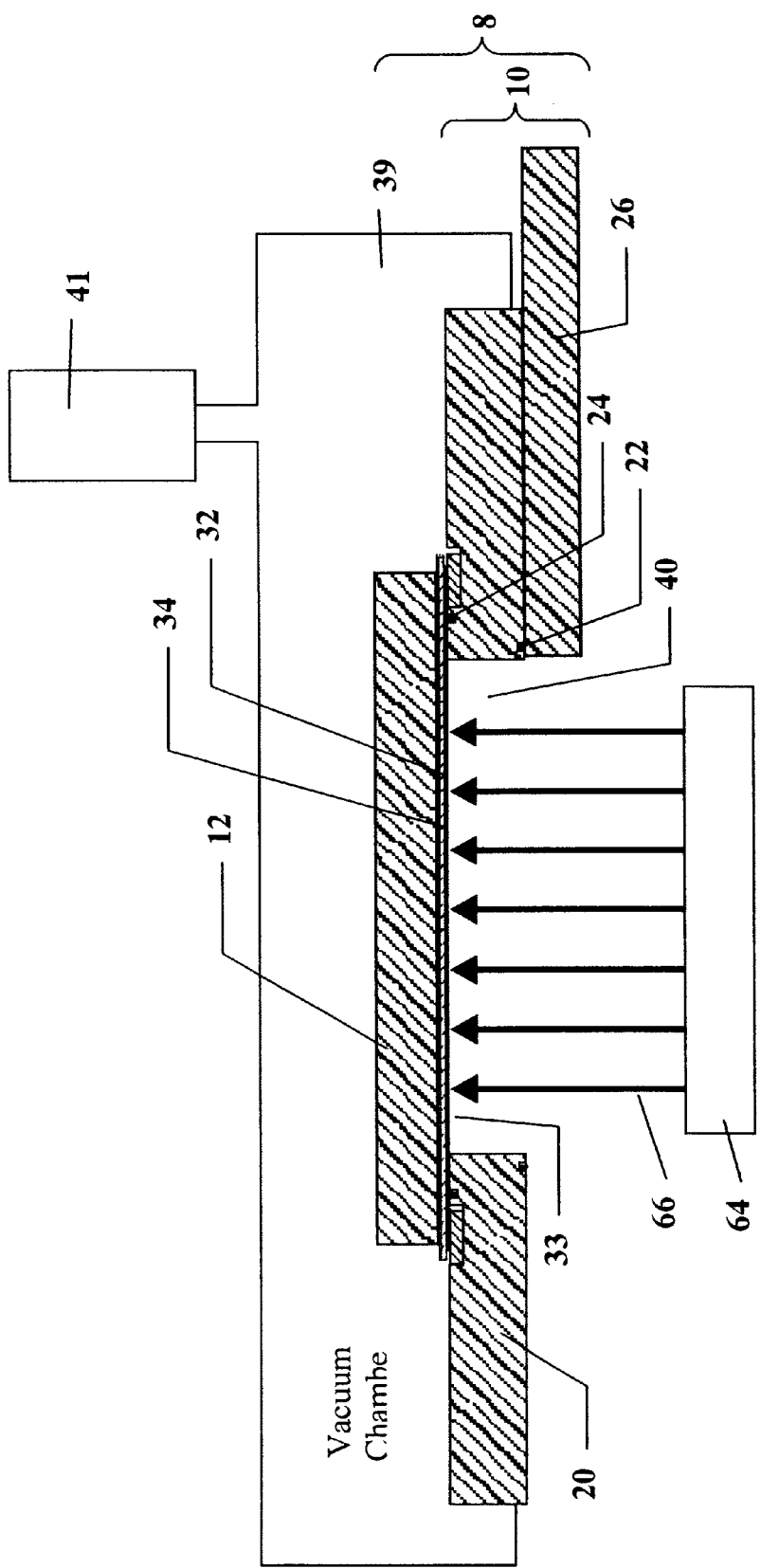
FIG. 4b is a cross-sectional view of the use of the aforementioned apparatus with flash light.

FIG. 4b shows another means of using apparatus 8 with light. Movable member 26 is shown in its open position, which is also called the radiation-receiving position because it permits the transmission of radiation to non-transfer surface 33 of donor 32. When movable member 26 is opened, flash lamp 64 directs flash light 66 onto donor 32, and in doing so illuminates non-transfer surface 33 of donor 32 with radiation, for example flash light 66, for the purpose of transferring donor material to substrate 34.

Figure 5A:
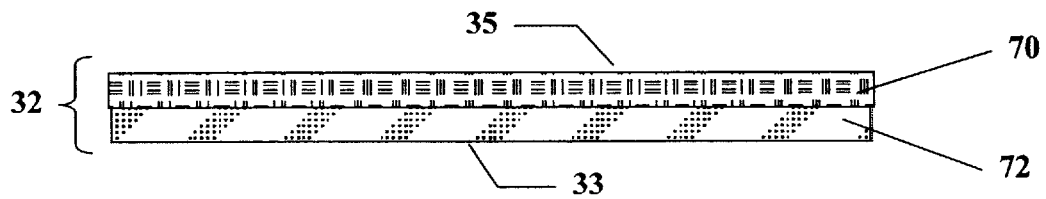
FIG. 5a shows one embodiment of the structure of a donor usable in this invention.

FIG. 5a shows one embodiment of the structure of donor 32. Donor 32 includes at the minimum a donor support element 72 that is preferably flexible, which comprises non-transfer surface 33. Donor support element 72 has been uniformly coated with organic material 70, which includes transfer surface 35.

The donor support element 72 can be made of any of several materials which meet at least the following requirements: The donor support must be sufficiently flexible and possess adequate tensile strength to tolerate precoating steps and roll-to-roll or stacked-sheet transport of the support in the practice of the invention. Donor support element 72 must be capable of maintaining the structural integrity during the light-to-heat-induced transfer step while pressurized on one side, and during any preheating steps contemplated to remove volatile constituents such as water vapor. Additionally, donor support element 72 must be capable of receiving on one surface a relatively thin coating of organic material, and of retaining this coating without degradation during anticipated storage periods of the coated support. Support materials meeting these requirements include, for example, metal foils, certain plastic foils which exhibit a glass transition temperature value higher than a support temperature value anticipated to cause transfer of the transferable organic materials of the coating on the support, and fiber-reinforced plastic foils. While selection of suitable support materials can rely on known engineering approaches, it will be appreciated that certain aspects of a selected support material merit further consideration when configured as a donor support useful in the practice of the invention. For example, the support material can require a multi-step cleaning and surface preparation process prior to precoating with transferable organic material. If the support material is a radiation-transmissive material, the incorporation into the support or onto a surface thereof, of a radiation-absorptive material can be advantageous to more effectively heat the donor support and to provide a correspondingly enhanced transfer of transferable organic donor material from the support to the substrate, when using a flash of radiation from a suitable flash lamp or laser light from a suitable laser.

A typical OLED device can contain the following layers, usually in this sequence: an anode, a hole-injecting layer, a hole-transporting layer, a light-emitting layer, an electron-transporting layer, a cathode. Any or all of these can comprise organic material 70, thus forming an organic layer. Organic material 70 can be a hole-injecting material, a hole-transport material, an electron-transport material, an emissive material, a host material, or a combination of any of these materials.

Hole-Injecting (HI) Material

While not always necessary, it is often useful that a hole-injecting layer be provided in an organic light-emitting display. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in commonly-assigned U.S. Pat. No. 4,720,432, and plasma-deposited fluorocarbon polymers as described in commonly-assigned U.S. Pat. No. 6,208,075. Alternative hole-injecting materials reportedly useful in organic EL devices are described in EP 0 891 121 A1 and EP 1,029,909 A1.

Hole-Transport (HT) Material

Hole-transport materials useful as organic material 70 are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by commonly-assigned Brantley et al U.S. Pat. Nos. 3,567,450 and 3,658,520.

A more preferred class of aromatic tertiary amines are those which include at least two aromatic tertiary amine moieties as described in commonly-assigned U.S. Pat. Nos. 4,720,432 and 5,061,569. Such compounds include those represented by structural formula (A).

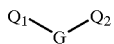

wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (A) and containing two triarylamine moieties is represented by structural formula (B):

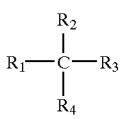

where $R_1$ and $R_2$ each independently represents a hydrogen atom, an aryl group, or an alkyl group or $R_1$ and $R_2$ together represent the atoms completing a cycloalkyl group; and $R_3$ and $R_4$ each independently represents an aryl group, which is in turn substituted with a diaryl substituted amino group, as indicated by structural formula (C):

wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by formula (C), linked through an arylene group. Useful tetraaryldiamines include those represented by formula (D).

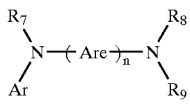

wherein each Are is an independently selected arylene group, such as a phenylene or anthracene moiety, n is an integer of from 1 to 4, and Ar, $R_7$, $R_8$, and $R_9$ are independently selected aryl groups.

In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural formulae (A), (B), (C), (D), can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

The hole-transporting layer can be formed of a single or a mixture of aromatic tertiary amine compounds. Specifically, one can employ a triarylamine, such as a triarylamine satisfying the formula (B), in combination with a tetraaryldiamine, such as indicated by formula (D). When a triarylamine is employed in combination with a tetraaryldiamine, the latter is positioned as a layer interposed between the triarylamine and the electron injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N-Phenylcarbazole
Poly(N-vinylcarbazole)
N,N'-di-1-naphthalenyl-N,N'-diphenyl-4,4'-diaminobiphenyl
4,4'-Bis[N-(1-naphthyl)-N-phenylamino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(l-naphthyl)-N-phenylamino]naphthalene Another class of useful hole-transport materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Material

Light-emitting materials useful as organic material 70 are well known. As more fully described in commonly-assigned U.S. Pat. Nos. 4,769,292 and 5,935,721, the light-emitting layer (LEL) of the organic EL element comprises a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in commonly-assigned U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802, 5,935,720; 5,935,721, and 6,020,078.

Metal complexes of 8-hydroxyquinoline and similar derivatives (Formula E) constitute one class of useful host compounds capable of supporting electroluminescence, and are particularly suitable for light emission of wavelengths longer than 500 nm, e.g., green, yellow, orange, and red.

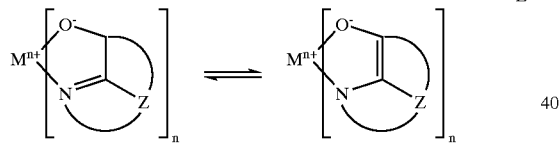

E wherein
M represents a metal;
n is an integer of from 1 to 3; and
Z independently in each occurrence represents the atoms completing a nucleus having at least two fused aromatic rings.

From the foregoing it is apparent that the metal can be monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato) aluminum(III)]

CO-2: Magnesium bisoxine [alias, bis(8-quinolinolato) magnesium(II)]

CO-3: Bis[benzo{f}-8-quinolinolato]zinc(II)

CO-4: Bis(2-methyl-8-quinolinolato)aluminum(III)-$\mu$-oxo-bis(2-methyl-8-quinolinolato) aluminum(III)

CO-5: Indium trisoxine [alias, tris(8-quinolinolato) indium]

CO-6: Aluminum tris(5-methyloxine) [alias, tris(5-methyl-8-quinolinolato) aluminum(III)]

CO-7: Lithium oxine [alias, (8-quinolinolato)lithium(I)]

Derivatives of 9,10-di-(2-naphthyl)anthracene (Formula F) constitute one class of useful hosts capable of supporting electroluminescence, and are particularly suitable for light emission of wavelengths longer than 400 nm, e.g., blue, green, yellow, orange or red.

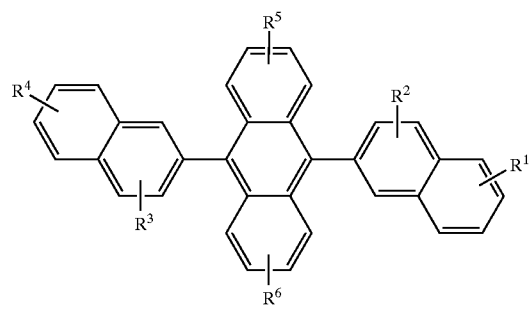

F wherein: $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;
Group 2: aryl or substituted aryl of from 5 to 20 carbon atoms;
Group 3: carbon atoms from 4 to 24 necessary to complete a fused aromatic ring of anthracenyl; pyrenyl, or perylenyl;
Group 4: heteroaryl or substituted heteroaryl of from 5 to 24 carbon atoms as necessary to complete a fused heteroaromatic ring of furyl, thienyl, pyridyl, quinolinyl or other heterocyclic systems;
Group 5: alkoxylamino, alkylamino, or arylamino of from 1 to 24 carbon atoms; and
Group 6: fluorine, chlorine, bromine or cyano.

Benzazole derivatives (Formula G) constitute another class of useful hosts capable of supporting electroluminescence, and are particularly suitable for light emission of wavelengths longer than 400 nm, e.g., blue, green, yellow, orange or red.

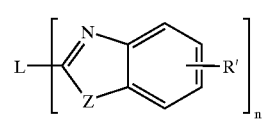

G

Where:
n is an integer of 3 to 8;
Z is O, NR or S; and
R' is hydrogen; alkyl of from 1 to 24 carbon atoms, for example, propyl, t-butyl, heptyl, and the like; aryl or heteroatom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring;

L is a linkage unit consisting of alkyl, aryl, substituted alkyl, or substituted aryl, which conjugately or unconjugately connects the multiple benzazoles together.

An example of a useful benzazole is 2,2',2"-(1,3,5-phenylene)tris[1-phenyl-1H-benzimidazole].

Desirable fluorescent dopants include derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, and carbostyryl compounds. Illustrative examples of useful dopants include, but are not limited to, the following:

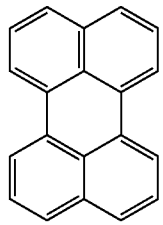

L1

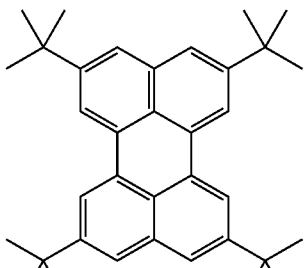

L2

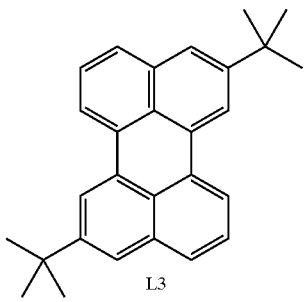

L3

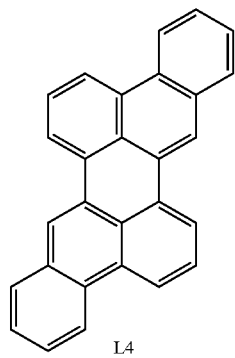

L4

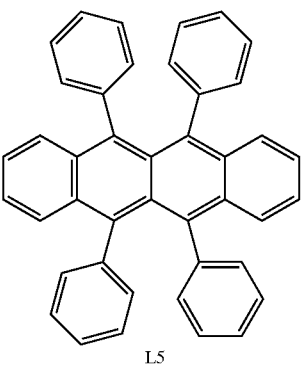

L5

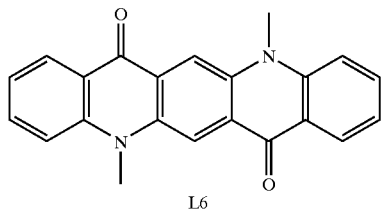

L6

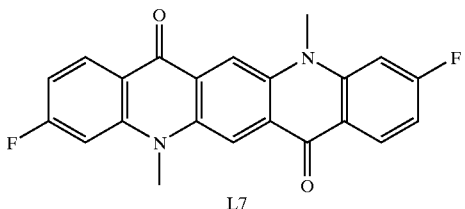

L7

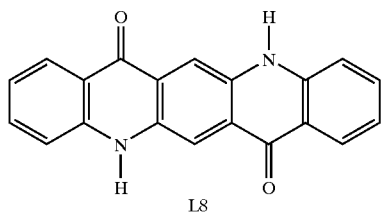

L8

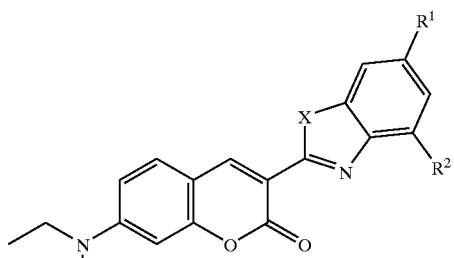

|  | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |

-continued
| | | | |
|---|---|---|---|
| L18 | S | Methyl | H |
| L19 | S | Methyl | Methyl |
| L20 | S | H | t-butyl |
| L21 | S | t-butyl | H |
| L22 | S | t-butyl | t-butyl |
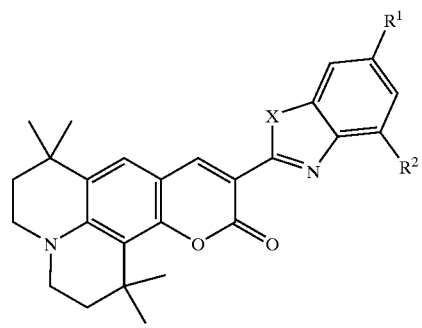
| | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |
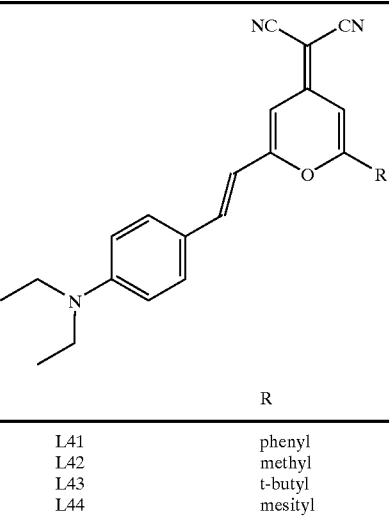
| | R |
|---|---|
| L37 | phenyl |
| L38 | methyl |
| L39 | t-butyl |
| L40 | mesityl |
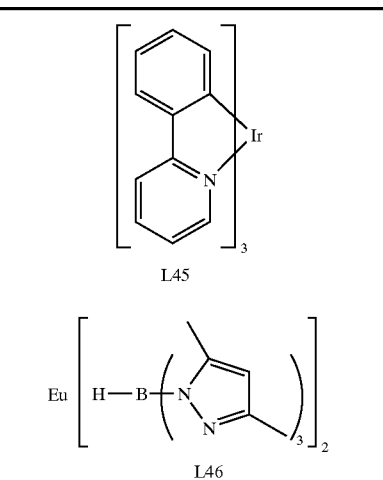
| | R |
|---|---|
| L41 | phenyl |
| L42 | methyl |
| L43 | t-butyl |
| L44 | mesityl |
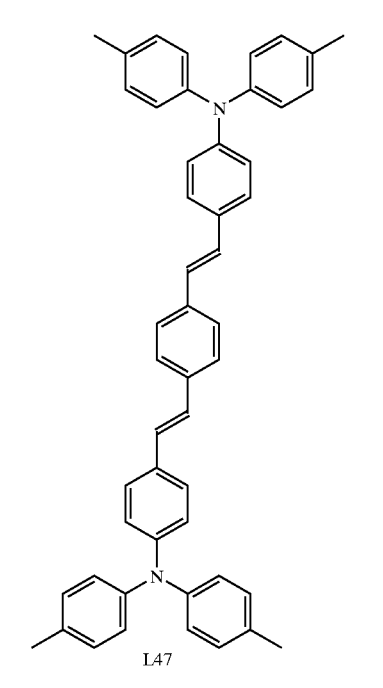

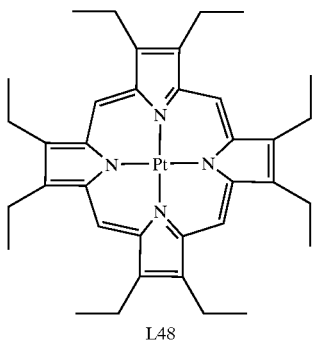

L48

Other organic emissive materials can be polymeric substances, e.g. polyphenylenevinylene derivatives, dialkoxy-polyphenylenevinylenes, poly-paraphenylene derivatives, and polyfluorene derivatives, as taught by Wolk et al in commonly assigned U.S. Pat. No. 6,194,119 B1 and references therein.

Electron-Transport (ET) Material

Preferred electron transport materials for use in organic EL devices of this invention are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural formula (E), previously described.

Other electron-transporting materials include various butadiene derivatives as disclosed in commonly-assigned U.S. Pat. No. 4,356,429 and various heterocyclic optical brighteners as described in commonly-assigned U.S. Pat. No. 4,539,507. Benzazoles satisfying structural formula (G) are also useful electron transporting materials.

Other electron-transport materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers*, Vols. 1–4, H. S. Nalwa, ed., John Wiley and Sons, Chichester (1997).

In some instances, a single layer can serve the function of supporting both light emission and electron transportation, and will therefore include emissive material and electron transport material.

Anode Material

The conductive anode layer is formed over the substrate and, when EL emission is viewed through the anode, should be transparent or substantially transparent to the emission of interest. Common transparent anode materials used in this invention are indium-tin oxide and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as an anode material. For applications where EL emission is viewed through the top electrode, the transmissive characteristics of the anode material are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials can be deposited by any suitable means such as evaporation, sputtering, chemical vapor deposition, or electrochemical means. Anode materials can be patterned using well-known photolithographic processes.

Cathode Material

When light emission is through the anode, the cathode material can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprised of a thin layer of a low work function metal or metal salt capped with a thicker layer of conductive metal. One such cathode is comprised of a thin layer of LiF followed by a thicker layer of Al as described in commonly-assigned U.S. Pat. No. 5,677,572. Other useful cathode materials include, but are not limited to, those disclosed in commonly-assigned U.S. Pat. Nos. 5,059,861; 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in commonly-assigned U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in commonly-assigned U.S. Pat. No. 5,276,380 and EP 0 732 868, laser ablation, and selective chemical vapor deposition.

Donor 32 must also include a radiation-absorbing material, which is capable of absorbing radiation in a predetermined portion of the spectrum and producing heat and which is, in this embodiment, incorporated into organic material 70 or support 72. Radiation-absorbing material can be a dye such as the dyes specified in commonly-assigned U.S. Pat. No. 5,578,416, a pigment such as carbon, or a metal such as nickel, chromium, titanium, etc.

Figure 5B:
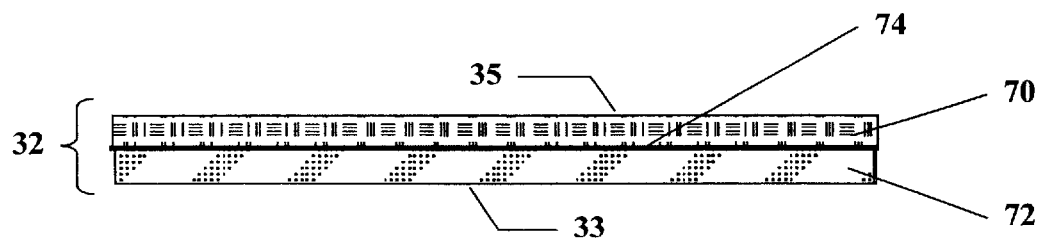
FIG. 5b shows another embodiment of the structure of a donor usable in this invention.

FIG. 5b shows another embodiment of the structure of donor 32. In this embodiment, support 72 is first uniformly coated with radiation-absorbing material 74, then coated with organic material 70. Support 72 then includes non-transfer surface 33 and organic material 70 comprises transfer surface 35. Radiation-absorbing material 74 is capable of absorbing radiation in a predetermined portion of the spectrum and producing heat as previously described.

Figure 5C:
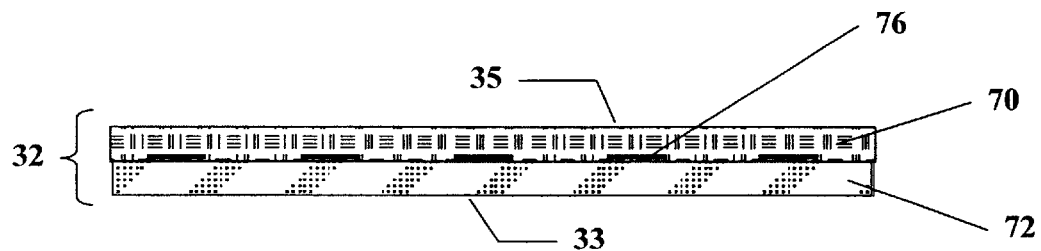
FIG. 5c shows another embodiment of the structure of a donor usable in this invention.

FIG. 5c shows another embodiment of the structure of donor 32. In this embodiment, support 72 is first coated with radiation-absorbing patterned layer 76, then with organic material 70. Support 72 then comprises non-transfer surface 33 and organic material 70 comprises transfer surface 35. Radiation-absorbing patterned layer 76 includes radiation-absorbing material capable of absorbing radiation in a predetermined portion of the spectrum and producing heat.

Figure 6A:
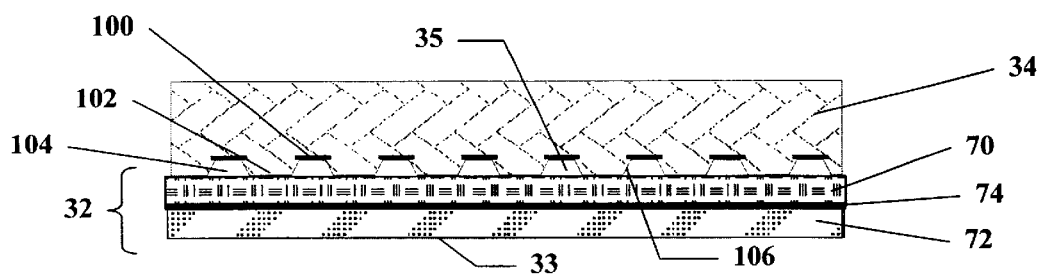
FIG. 6a shows a cross-sectional view of one embodiment of the placement of the donor against a substrate in accordance with this invention.

FIG. 6a shows a cross-sectional view of one embodiment of the relationship of donor 32 and substrate 34 relative to one another, that is, the placement of donor 32 against substrate 34 in accordance with this invention. In this embodiment, donor 32 and substrate 34 are disposed in a relationship relative to one another whereby there will be a separation between portions of donor 32 and substrate 34. Receiving surface 106 of substrate 34 is uneven due to the presence of thin-film transistors 100. Thin-film transistors 100 are separated in substrate 34 by raised surface portions 102 as a result of the multilayer construction of each pixel or subpixel. This is described by Tang in commonly-assigned U.S. Pat. No. 5,937,272, the contents of which are incorporated by reference. The presence of raised surface portions 102 maintains the separation of gap 104 against the pressure (not shown) that is exerted by the pressurizing gas against non-transfer surface 33 and maintains a separation between portions of donor 32 and substrate 34.

Figure 6B:
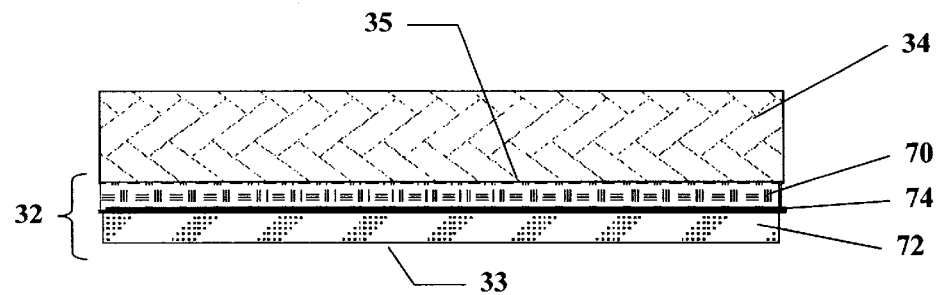
FIG. 6b shows a cross-sectional view of another embodiment of the placement of the donor against a substrate in accordance with this invention.

FIG. 6b shows a cross-sectional view of another embodiment of the relationship of donor 32 and substrate 34 relative to one another, that is, the placement of donor 32 against substrate 34 in accordance with this invention. In this embodiment, donor 32 and substrate 34 are disposed in a relationship relative to one another whereby substrate 34 and donor 32 will be in contact. Transfer surface 35 of donor 32 is held in full contact with substrate 34 by the pressure (not shown) that is exerted by the pressurizing gas against non-transfer surface 33.

Figure 7A:
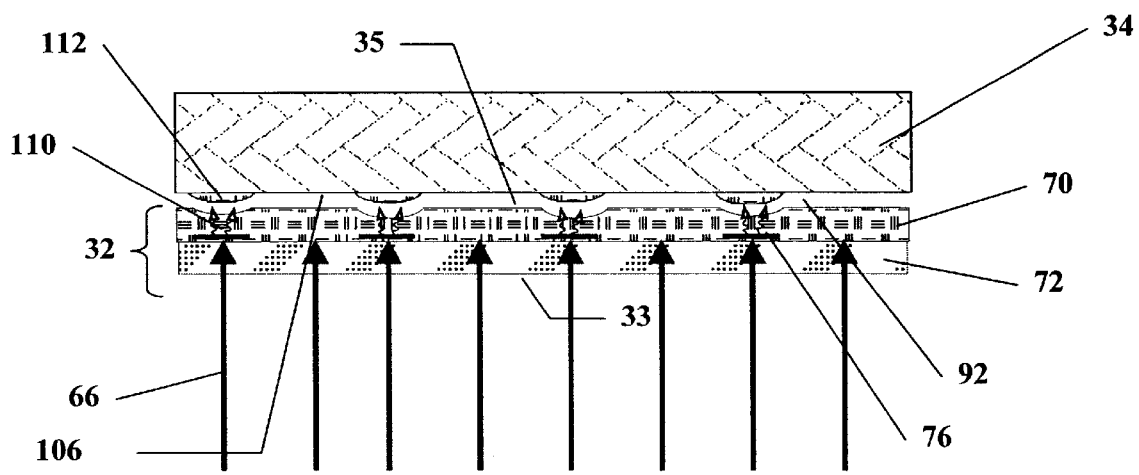
FIG. 7a shows a cross-sectional view of the transfer of organic material from donor to substrate by one method of treatment with light.

FIG. 7a shows a cross-sectional view of the transfer of organic material 70 from donor 32 to portions of substrate 34 by one method of treatment with light. In this embodiment, donor 32 has been prepared with radiation-absorbing patterned layer 76. Flash light 66 irradiates non-transfer surface 33. Heat 110 is produced when flash light 66 strikes radiation-absorbing patterned layer 76. This heats organic material 70 in the immediate vicinity of radiation-absorbing patterned layer 76. In this embodiment, only a portion of the light directed onto donor 32 (i.e. that which impinges directly on radiation-absorbing patterned layer 76) will be converted to heat. Some or all of the heated portion of organic material 70 is sublimed, vaporized, or ablated and thus transferred, forms a layer of organic material on desired portions of substrate 34, said layer here represented by transferred organic material 112 on receiving surface 106 of substrate 34 in a patterned transfer.

Figure 7B:
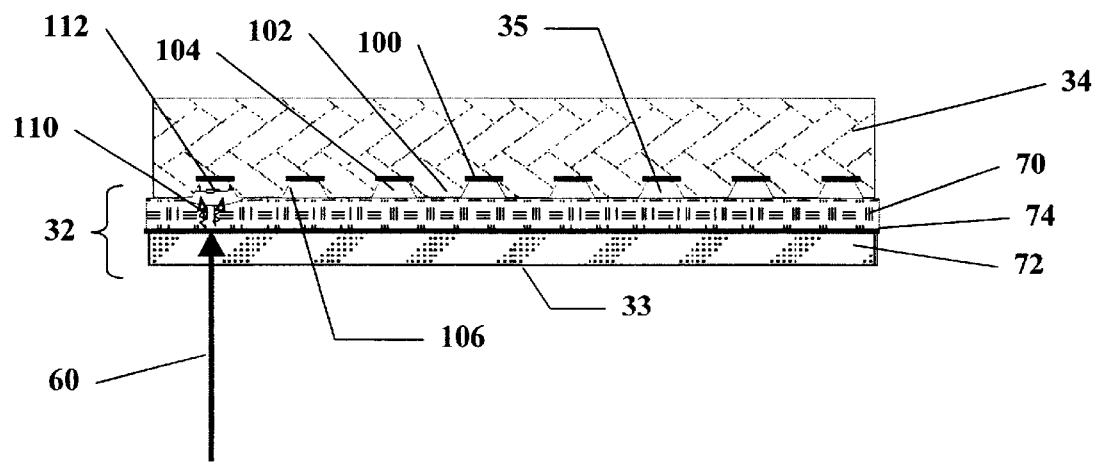
FIG. 7b shows a cross-sectional view of the transfer of organic material from donor to substrate by another method of treatment with light.

FIG. 7b shows a cross-sectional view of the transfer of organic material 70 from donor 32 to portions of substrate 34 by another method of treatment with light. In this embodiment, donor 32 has been prepared with radiation-absorbing material 74 and gap 104 is maintained by the structure of thin-film transistors 100 and intervening raised surface portions 102. A pattern of laser light 60 irradiates non-transfer surface 33. Heat 110 is produced when laser light 60 strikes radiation-absorbing material 74. This heats organic material 70 in the immediate vicinity of laser light 60. In this embodiment, a large portion of the light directed onto donor 32 will be converted to heat, but this will only happen at selectively irradiated portions of donor 32. Some or all of the heated portion of organic material 70 is sublimed, vaporized, or ablated and thus transferred, forms a layer of organic material on desired portions of substrate 34, said layer here represented by transferred organic material 112 on receiving surface 106 of substrate 34 in a patterned transfer.

Figure 8:
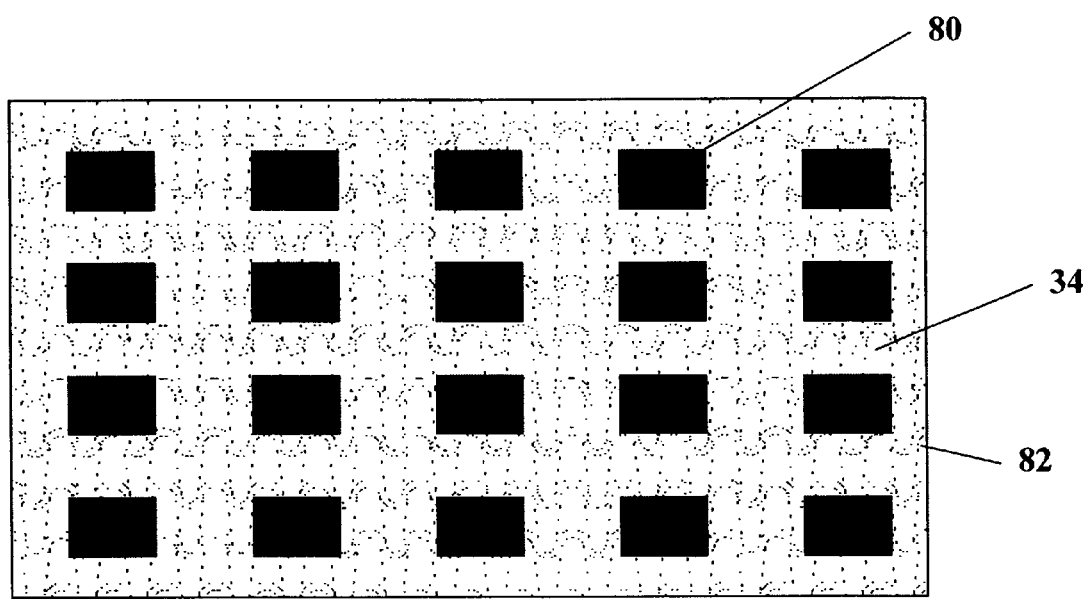
FIG. 8 shows a plan view of the treated substrate.

Turning now to FIG. 8, and referring also to FIG. 7a, and 7b, there is shown a plan view of treated substrate 82, which has been treated in the manner described in this invention. Predetermined portions of organic material 70 have been transferred to substrate 34 in transferred pattern 80. Transferred pattern 80 has been formed in a manner consistent with the end-use of treated substrate 82 (e.g. transferred pattern 80 is of an OLED light-emissive material that has been transferred to the positions of existing thin-film transistors on substrate 34). Transferred pattern 80 reflects the method used to prepare it (e.g. radiation-absorbing patterned layer 76 in FIG. 7a or the pattern of laser light 60 irradiation in FIG. 7b).

It shall be understood that first fixture 10 can be arranged to be in a position to perform some or all of the functions of second fixture 12, and second fixture 12 can perform some or all of the functions of first fixture 10 in a manner analogous to that described by Phillips et al in above-cited commonly assigned U.S. patent application Ser. No. 10/021, 410.

The invention has been described in detail with particular reference to certain preferred embodiments thereof, but it will be understood that variations and modifications can be effected within the spirit and scope of the invention.

Parts List 8 apparatus
10 first fixture
12 second fixture
14 machined slot
20 base plate
22 gasket
24 gasket
26 movable member
30 rigid frame
32 donor
33 non-transfer surface
34 substrate
35 transfer surface
38 plate
39 vacuum chamber
40 second chamber
41 vacuum pump
42 gas inlet
44 gas passage
45 first chamber
46 gas supply
48 channel
60 laser light
62 laser
64 flash lamp
66 flash light
70 organic material Parts List Cont'd 72 support
74 radiation-absorbing material
76 radiation-absorbing patterned layer
80 transferred pattern
82 treated substrate
92 gap
98 gap
100 thin-film transistor
102 raised surface portion
104 gap
106 receiving surface
110 heat
112 transferred organic material

What is claimed is:

1. Apparatus for transferring organic material from a donor onto a substrate to form a layer of organic material on one or more OLED devices, comprising:

(a) a vacuum chamber under reduced pressure;

(b) a first fixture disposed in the vacuum chamber;

(c) a second fixture disposed in the vacuum chamber and to be aligned with and engaging the first fixture to clamp the donor and substrate which are supported by at least one of the first and second fixtures and forming a second chamber positioned relative to a non-transfer surface of the donor;

(d) means for supplying a gas to the second chamber to apply pressure to the non-transfer surface of the donor so as to ensure the position of the donor relative to the substrate;

(e) the first fixture including a movable member movable between a closed position defining a surface of the chamber and an open radiation-receiving position to permit transmission of radiation to the non-transfer surface of the donor so that heat will be produced and the organic material will transfer from the donor to the substrate; and (f) an illumination source for directing radiation onto the donor through the open radiation-receiving position to cause the transfer of organic material to the substrate.

2. The apparatus of claim 1 wherein the donor is supported by one of the fixtures and the substrate by the other fixture, or both are supported by the same fixture such that the substrate and donor are in a relationship relative to one another whereby there will be either a separation between portions of the substrate and the donor, or the substrate and donor are in contact, and wherein organic material is transferred onto portions of the substrate.

3. The apparatus of claim 2 wherein the substrate is supported by the second fixture and the donor is supported by the first fixture.

4. The apparatus of claim 1 wherein the illumination source produces laser light.

5. A method for transferring organic material from a donor onto a substrate to form a layer of organic material on one or more OLED devices, comprising the steps of:

(a) aligning first and second fixtures in a reduced pressure environment and positioning the substrate and donor in a chamber defined by the aligned first and second fixtures;

(b) increasing the pressure applied to the non-transfer surface of the donor so as to ensure the position of the donor relative to the substrate;

(c) after step (b), moving a member provided on the first fixture from a closed to an open position which permits the transmission of radiation onto the non-transfer surface of the donor so that heat will be produced and organic material transferred from the donor to the substrate; and (d) illuminating with radiation the donor through the open radiation-receiving position to cause the transfer of organic material to the substrate.

6. The method of claim 5 wherein step (a) includes disposing the substrate and donor in a relationship relative to one another whereby there will be either a separation between portions of the substrate and the donor, or the substrate and donor are in contact, and wherein organic material is transferred onto portions of the substrate.

7. The method of claim 6 wherein the substrate is supported by the second fixture and the donor is supported by the first fixture.

* * * * *